(12) United States Patent
Baum et al.

(10) Patent No.: US 11,035,038 B2
(45) Date of Patent: Jun. 15, 2021

(54) COLD SINTERING OF SOLID PRECURSORS

(71) Applicant: Entegris, Inc., Billerica, MA (US)

(72) Inventors: Thomas H. Baum, New Fairfield, CT (US); Yuqi Li, Danbury, CT (US); David James Eldridge, Liberty Hill, TX (US); Robert L. Wright, Newtown, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/766,251

(22) PCT Filed: Oct. 6, 2016

(86) PCT No.: PCT/US2016/055826
§ 371 (c)(1),
(2) Date: Apr. 5, 2018

(87) PCT Pub. No.: WO2017/062670
PCT Pub. Date: Apr. 13, 2017

(65) Prior Publication Data
US 2018/0282863 A1 Oct. 4, 2018

Related U.S. Application Data

(60) Provisional application No. 62/238,078, filed on Oct. 6, 2015.

(51) Int. Cl.
*C09D 1/00* (2006.01)
*C23C 16/448* (2006.01)
(Continued)

(52) U.S. Cl.
CPC ............ *C23C 16/4481* (2013.01); *B22F 3/02* (2013.01); *C04B 35/00* (2013.01);
(Continued)

(58) Field of Classification Search
CPC .......... C23C 16/448; C09D 1/00; C09D 5/00; C04B 35/6303; C04B 35/634
See application file for complete search history.

(56) References Cited

U.S. PATENT DOCUMENTS 4,072,599 A 2/1978 Bullough et al.
4,285,732 A * 8/1981 Charles ................ C04B 35/115
501/101
(Continued)

FOREIGN PATENT DOCUMENTS

CN 101128394 A 2/2008
CN 102292290 A * 12/2011 ................ C01F 7/16
(Continued)

OTHER PUBLICATIONS

Guo, Hanzheng, et al., "Hydrothermal-Assisted Cold Sintering Process: A New Guidance for Low-Temperature Ceramic Sintering". ACS Appl. Mater. Interfaces 2016, 8, 20909-20915.*
(Continued)

*Primary Examiner* — Bret P Chen
(74) *Attorney, Agent, or Firm* — Entegris, Inc.

(57) ABSTRACT

A solid delivery precursor is described, which is useful for volatilization to generate precursor vapor for a vapor deposition process. The solid delivery precursor comprises solid bodies of compacted particulate precursor, e.g., in a form such as pellets, platelets, tablets, beads, discs, or monoliths. When utilized in a vapor deposition process such as chemical vapor deposition, pulsed chemical vapor deposition, or atomic layer deposition, the solid delivery precursor in the form of solid bodies of compacted particulate precursor provide substantially increased flux of precursor vapor when subjected to volatilization conditions, in relation to the particulate precursor. As a result, vapor deposition process operation can be carried out in shorter periods of time, thereby achieving increased manufacturing rates of products
(Continued)

such as semiconductor products, flat-panel displays, solar panels, LEDs, optical coatings, and the like.

10 Claims, 2 Drawing Sheets

(51) Int. Cl.
*C04B 35/00* (2006.01)
*B22F 3/02* (2006.01)
*C04B 35/515* (2006.01)
*C04B 35/63* (2006.01)
*C04B 35/634* (2006.01)
*C09D 5/00* (2006.01)

(52) U.S. Cl.
CPC ...... *C04B 35/5152* (2013.01); *C04B 35/6303* (2013.01); *C04B 35/634* (2013.01); *C09D 1/00* (2013.01); *C09D 5/00* (2013.01); *C23C 16/448* (2013.01); *C04B 2235/444* (2013.01); *C04B 2235/604* (2013.01)

(56) References Cited

U.S. PATENT DOCUMENTS

| | | | |
|---|---|---|---|
| 4,921,819 A * | 5/1990 | Ramachandran | C04B 35/111 428/364 |
| 4,981,821 A | 1/1991 | Stendera et al. | |
| 5,184,662 A * | 2/1993 | Quick | B22F 1/0096 164/100 |
| 5,608,157 A | 3/1997 | Orr et al. | |
| 5,820,678 A * | 10/1998 | Hubert | C23C 16/4481 118/690 |
| 6,660,328 B1 * | 12/2003 | Dahmen | C23C 16/4481 118/726 |
| 2002/0110475 A1 * | 8/2002 | Watari | C04B 35/111 419/57 |
| 2009/0011266 A1 * | 1/2009 | Cochran | C22C 1/0491 428/545 |
| 2009/0123361 A1 | 5/2009 | Johannessen et al. | |
| 2009/0159003 A1 * | 6/2009 | Noguchi | C23C 16/4481 118/715 |
| 2009/0215225 A1 * | 8/2009 | Stender | C07C 333/16 438/102 |
| 2010/0095865 A1 * | 4/2010 | Xu | C07F 17/02 106/1.21 |
| 2010/0112211 A1 * | 5/2010 | Xu | C07C 211/65 427/248.1 |
| 2010/0255198 A1 * | 10/2010 | Cleary | C23C 16/18 427/255.39 |
| 2011/0111190 A1 * | 5/2011 | Wei | C23C 4/10 428/213 |
| 2011/0286873 A1 * | 11/2011 | Binder | C22C 33/0228 419/5 |
| 2011/0319691 A1 * | 12/2011 | Sun | B01J 38/12 585/654 |
| 2012/0012326 A1 | 1/2012 | Darby et al. | |
| 2012/0178266 A1 * | 7/2012 | Heys | C23C 16/405 438/785 |
| 2012/0193148 A1 * | 8/2012 | Overstreet | B23K 31/025 175/320 |
| 2014/0120723 A1 | 5/2014 | Fu et al. | |
| 2014/0329025 A1 * | 11/2014 | Cleary | C23C 16/30 427/523 |
| 2015/0251920 A1 * | 9/2015 | Li | C23C 16/18 427/250 |
| 2016/0305019 A1 * | 10/2016 | Birtcher | C23C 16/45561 |
| 2017/0137326 A1 * | 5/2017 | Okochi | H01B 1/023 |
| 2019/0202740 A1 * | 7/2019 | Laurin | C04B 35/453 |

FOREIGN PATENT DOCUMENTS

| | | | |
|---|---|---|---|
| JP | 2010502833 A | 1/2010 | |
| JP | 2012255193 A | 12/2012 | |
| WO | WO 2010/069020 A2 * | 6/2010 | B22F 1/00 |

OTHER PUBLICATIONS

Boukhalfa, Sofiane, et al., "Atomic layer deposition of vanadium oxide on carbon nanotubes for high-power supercapacitor electrodes". Energy Environ. Sci., 2012, 5, pp. 6872-6879.*

Guo, Jing, et al., "Cold sintering process: A new era for ceramic packaging and microwave device development". J Am Ceram Soc. 2017; 100: 669-677.*

Quan, Yong Chun, et al, "Polymer-like Organic Thin Films Deposited by Plasma Enhanced Chemical Vapor Deposition Using the Para-xylene Precursor as Low Dielectric Constant Interlayer Dielectrics for Multilevel Metallization". Jpn. J. Appl. Phys. 38 (1999) Pt .1, No. 3A, pp. 1356-1358.*

Grasso, Salvatore, et al., "A review of cold sintering processes". Advances in Applied Ceramics 2020, vol. 119, No. 3, 115-143. https://doi.org/10.1080/17436753.2019.1706825.*

* cited by examiner

COLD SINTERING OF SOLID PRECURSORS

CROSS-REFERENCE TO RELATED APPLICATIONS

This application is filed under the provisions of 35 U.S.C. § 371 claiming priority of International Patent Application No. PCT/US2016/55826 filed on Oct. 6, 2016, which further claims the benefit under 35 USC 119 of U.S. Provisional Patent Application No. 62/238,078 filed Oct. 6, 2015, the disclosure of which is hereby incorporated herein by reference in its entirety for all purposes.

FIELD

The present disclosure relates to solid precursors useful in solid delivery applications in which the solid precursor is volatilized to form corresponding precursor vapor for vapor deposition processes, e.g., in the manufacture of semiconductor products, flat-panel displays, solar panels, LEDs and optical coatings, as well as to solid delivery apparatus comprising such solid precursors, and processes for making and utilizing such solid precursors.

BACKGROUND

In the use of solid precursors that are volatilized to form corresponding precursor vapor for applications such as the manufacture of semiconductor products, flat-panel displays, solar panels, LEDs and optical coatings, the solid precursor is frequently used in a finely divided form to maximize surface to volume ratio, so that when heated, a corresponding maximum surface area is available for phase transition of the solid to a vapor form.

Solid precursors, i.e., precursors that are solid at ambient temperature and pressure conditions (e.g., 25° C. and 1 atm pressure), have significant advantages over alternative liquid or gaseous precursors in many applications, as regards packaging and handling characteristics, volumetric considerations, ease of purification, and manufacturability.

SUMMARY

Due to the widespread use of solid precursors in the aforementioned applications, the art is continually focused on achieving improvements that provide higher fluxes of precursor vapor in the vapor generation operations that are utilized for such purpose, as well as enhancement in the thermal management of such vapor generation operations, and precursors in a form that enable more precursor to be loaded in a same volume of the vaporizer, leading to a lower cost-of-ownership of the vapor supply system.

The present disclosure relates to solid source reagents precursors that are useful in solid delivery applications for vapor deposition processes, such as, by way of non-limiting example, chemical vapor deposition, pulsed chemical vapor deposition, atomic layer deposition, and other methods and techniques where vapor is utilized on source material, as well as to solid delivery apparatus comprising such solid precursors, and processes utilizing such solid precursors.

In one aspect, the disclosure relates to a solid source delivery precursor useful for volatilization to generate precursor vapor for a vapor deposition process, said solid delivery precursor comprising solid bodies of compacted particulate precursor.

In another aspect, the disclosure relates to a solid delivery apparatus, comprising a vaporizer comprising a vaporizer vessel adapted for holding a solid source delivery precursor of the present disclosure.

In another aspect, the disclosure relates to a solid delivery apparatus, comprising a vaporizer comprising a vaporizer vessel adapted for holding a solid source delivery precursor of the present disclosure.

In another aspect, the disclosure relates to a solid delivery apparatus, comprising a vaporizer comprising a vaporizer vessel holding a solid source delivery precursor of the present disclosure.

A further aspect of the disclosure relates to a manufacturing facility configured to manufacture a product selected from the group consisting of semiconductor products, flat-panel displays, solar panels, LEDs and optical coatings, such manufacturing facility comprising a solid delivery apparatus of the present disclosure, as configured for delivery of the precursor vapor to a precursor vapor-utilizing tool in the manufacturing facility.

In a further aspect, the disclosure relates to a vapor deposition process, comprising volatilizing a solid delivery precursor of the present disclosure, to generate corresponding precursor vapor, and depositing, under vapor deposition conditions, a material from the precursor vapor on a substrate.

An additional aspect of the disclosure relates to a method of making a solid delivery precursor of the present disclosure, such method comprising compacting particulate precursor under sufficient pressure to consolidate the particulate precursor in a unitary solid body.

Other aspects, features and embodiments of the disclosure will be more fully apparent from the ensuing description and appended claims.

DETAILED DESCRIPTION

Figure 1:
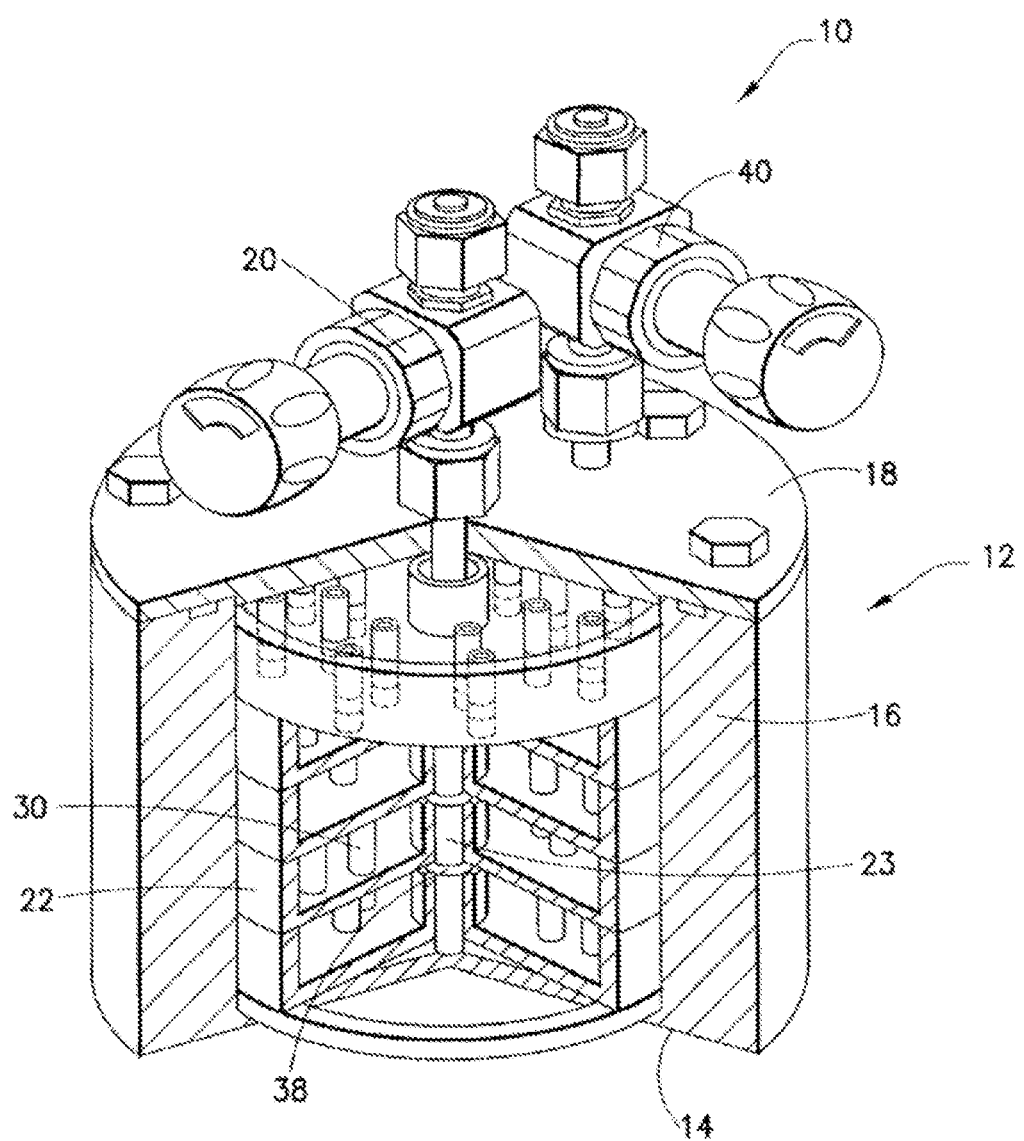
FIG. 1 is a perspective view of a vaporizer of a type useful in various embodiments of the present disclosure for volatilization of the compacted precursor.

The present disclosure relates to solid precursors useful in solid delivery to form corresponding vapor for vapor deposition applications, such as manufacture of semiconductor products, flat-panel displays, solar panels, LEDs and optical coatings. The disclosure relates to solid source precursors as well as solid delivery packages containing such solid source precursors, and processes for making and using such solid precursors.

As indicated in the background section of the present disclosure, the art frequently has employed solid precursors in a finely divided form, as powders that are heated to form corresponding precursor vapor. In such usage, it has generally been considered highly desirable to minimize particle size of the particulate material, e.g., by use of milling and grinding operations, so as to maximize surface to volume ratio and provide maximum surface area for generating vapor from the heated solid particles.

Contrary to such conventional wisdom, however, it has been surprisingly and unexpectedly discovered that when particulate solid precursor material is highly compacted, to form compacted solid bodies, e.g., in the form of pellets, platelets, tablets, beads, discs, monoliths, and the like, such compacted solid bodies are capable of yielding markedly higher levels of precursor material flux when heated in the volatilization operation that is employed to generate the precursor vapor from the precursor solid. Further, such compacted solid bodies offer, as a collateral advantage, the ability to avoid particle transport and the "dusting" and solids shifting behavior that is encountered when the corresponding finely divided powder material is employed for vapor generation, as well as relaxing the requirements for fine particle filters in the vaporizer vessel that are necessary in order to avoid entrainment of fine particles of the precursor in the vapor that is being discharged from the vaporizer vessel for delivery to a downstream precursor vapor-utilizing process system.

The advantages of the present disclosure have been demonstrated to provide substantial increases in flux of delivered precursor vapor of at least 15%, up to 50% and more, in relation to the flux achievable with corresponding precursor in finely divided powder form, at identical temperature and flow rate of carrier gas contacted with the volatilizing solid. In specific embodiments, the increase in flux of delivered precursor vapor may be at least any of 20%, 25%, 30%, 35%, 40%, or 45%, up to a respectively higher value, that in specific ranges may be up to 40%, 45%, 50%, 55%, 60%, 65%, 70%, 75%, 100%, 200%, 500%, 1000% or more.

Accordingly, the present disclosure contemplates compacted solid precursor bodies that are substantially compacted in relation to corresponding precursor as synthesized in a low density powder form. In various embodiments, the compacted solid precursor bodies may have a piece density, as determined by pycnometric techniques measuring the bulk density of an individual piece of the compacted material (e.g., in the form of pellets, platelets, beads, discs, monoliths, or other compacted piece forms) that is at least 15% higher than the bulk density of a same mass of the precursor in powder form, measured as an envelope density of the free-flowing powder, and in specific embodiments the piece density of the compacted solid precursor body may be at least 20%, 25%, 30%, 35%, 40%, 45%, 50%, 55%, 60%, 65%, 70%, 75%, 80%, 85%, 90%, 95%, 100%, 110%, 120%, 130%, 140%, 150%, and up to 2000% or more, higher than the bulk density of the same mass of the precursor in particulate form, where the bulk density of the precursor in particulate form is measured as an envelope density of the free-flowing powder, and wherein the bulk density of an individual piece of the compacted material may approach 100% of the absolute density of the material, e.g., may be at least 80%, 82%, 85%, 87%, 90%, 91%, 92%, 93%, 94%, 95%, 96%, 97%, 98%, and 99% of absolute density of the material.

As used in such context, the envelope density, or bulk density, of the precursor in powder form is determined by pouring the free-flowing powder into a container, or "envelope," in which the powder is not further vibrated, compacted, or consolidated, so that the density determined is inclusive of pores, interstitial volume, and other void volume in the powder sample.

The absolute density of the precursor material is the density that is determined without inclusion of void volume, and thus is a void-free intrinsic density of the precursor material.

The piece density of the compacted precursor material body is the bulk density of the compacted precursor material body including any voids within the compacted body, but without inclusion of any void volume exterior to the compacted body.

It will be appreciated that the voids within the compacted body will be reduced depending on the nature and extent of compaction to which the starting material for the compacted body is subjected. For example, the starting material may be in powder form that is compressed in a compression die or other apparatus for exerting compression on the material and consolidating it in a unitary piece form, as the product compacted body. As the magnitude of the compressive force is increased, the voids are further "compressed out" of the precursor material, and the bulk density of the compacted body becomes progressively closer to the intrinsic or true (absolute) density of the precursor material. The compaction may for example be effected by a pellet mill, a single station press, a multi-station press, an extruding press, or any other suitable apparatus that is configured to apply compaction pressure to the starting material so that the starting material is compacted to a unitary body form of higher density.

The unitary body of the compacted precursor material may have any suitable dimensions, and may have any suitable shape or conformation as a compressed solid. In various embodiments, the compacted precursor material may be provided in a unitary body having dimensions of 0.2 cm or more, although in other embodiments compacted precursor material unitary bodies of smaller size may be preferred. By way of illustrative example, the unitary body of the precursor material in various embodiments may be in a form of a platelet or tablet, having a face each of whose dimensions is in a range of from 0.2 to 2.5 cm, and whose thickness is in a range of from 0.2 to 2.5 cm. As another example, the unitary body of the precursor material may be in the form of a cylindrical puck, having a diameter in a range of from 2 to 20 cm, and a thickness in a range of from 1 to 4 cm. The shape or conformation of the unitary body of the compacted precursor material may be geometrically regular or irregular in character, and in general it may be of any space-filling geometric form appropriate to the particular vaporizer or vaporization environment in which the precursor material is employed. For example, in some embodiments, the unitary body of the precursor material may be generally equivalent to, or otherwise consistent with, the dimensions of the interior volume in the vaporizer container in which the unitary body of the precursor material is deployed. When a multiplicity of the compacted unitary bodies are employed, the size and shape of the precursor material unitary bodies may be selected to provide optimum space filling of the interior volume of the vaporizer. For example, the unitary bodies may be cylindrically shaped pellets having equal length (L) and diameter (D) dimensions, e.g., pellets 2 mm thick and 2 mm diameter (i.e., L/D=1).

Non limiting examples include Co, Hf, Zr, Al, Ti, W, Mo, Ba, Nb, Pb, Mg, Mn, Ta, Fe, Ni, Cu, Zn, Ga, B, Si, Ge, Sr, La, Y, Ir, Pt, Pd, Rh, Ru, In, Sn, Bi, Y, Ce, Pr, Eu, Er, Yb, Lu and Dy, halides, carbonyls, oxyhalides, alkyls, alkoxides, cyclopentadienyls, beta-diketonates, silyls, amidinates, formamidinates, carboxylates, $HfCl_4$, $ZrCl_4$, $AlCl_3$, $TiCl_4$, $WCl_6$, $WCl_5$, $NbCl_4$, $MoOCl_4$, $NbF_4$, $W(CO)_6$, $Mo(CO)_6$, $Co(CO)_6$, $Co_2(CO)_8$, dicobalt hexacarbonyl hexafluoro-2- butyne, dicobalt hexacarbonyl tert-butyl propyne, DiCobalt Hexacarbonyl Trimethylsilyl Propyne, (CO)2CoNO (CNtBu), (3,3-Dimethyl-1-butyne)dicobalthexacarbonyl, cobalt carbonyl bis(trimethylsilyl acetylene), dicobalt hexacarbonyl trimethylsilyl acetylene, bis (trimethylsilyl)amido cobalt (II), trimethoxypentamethylcyclopentaienyl)titanium, pentakisdimethylamino tantalum, trimethylindium, bis-cyclopentadiene magnesium, tetramethyl zinc, tetraethyl zinc, combinations and derivatives of the foregoing as well as any other precursor materials that are solid at ambient temperature conditions of 20-30° C. and ambient pressure of about 1 atm.

The starting material for forming the compacted precursor unitary bodies may be in any suitable starting material form that is compactible to form such unitary bodies. Preferably, the starting material is in a finely divided form, as a powder or granular material. The starting material when compacted to a unitary body must thereafter retain sufficient structural integrity for subsequent use of the precursor material in such form. For example, the compacted precursor material unitary bodies when loaded into a vaporizer at the point of use for generation of precursor vapor desirably retain sufficient structural integrity to maintain the unitary body form during such loading and subsequent installation and initial use of the vaporizer, and advantageously have sufficient structural integrity to accommodate packaging and transport from the manufacturing site to the point of use. In general, it is desirable to maintain the original unitary body form of the compacted precursor material through at least initial vaporization operations, but in some instances it may be desirable to form a unitary body of the compacted precursor material with partitioning layers or evanescent regions, so that a larger initial body of the compacted material divides into component smaller pieces, e.g., upon application of heat to the compacted precursor material body.

In this respect, if the compacted precursor material unitary bodies are disposed in a vaporizer at a point of manufacture of the vaporizer vessel or at a point of filling, and the filled vaporizer thereafter is transported as a closed vessel to the site of use, then the compacted material unitary bodies must accommodate such handling and subsequent transport and vaporizer vessel installation at the process facility at which vapor is to be generated for use, without adverse effect on the subsequent vapor generation operation. Accordingly, it is preferred to form the compacted unitary bodies of the precursor material in a form that will be maintained through at least an initial phase of subsequent vaporization operations, and with minimum attrition, dusting behavior, and the like.

In general, the compacted material should be sufficiently self-adherent so that particles are granules of the starting material cohere with one another in the consolidated mass forming the unitary bodies of the precursor material, or alternatively, if the compacted material is not sufficiently self-adherent to maintain a unitary body form, an inert non-volatile binder or other matrix material may be added to the starting material to ensure that the unitary body form is satisfactorily achieved and maintained in the production of the precursor material of the present disclosure.

The binder or matrix material in such instance is preferably non-volatile at the volatilization conditions to which the compacted material unitary bodies are subjected for generating the precursor vapor, or, if volatile at such conditions, then the corresponding vapor of the binder or matrix material is desirably benign in respect of the vapor deposition process to which the generated precursor vapor is flowed. The binder or matrix material may for example comprise a non-volatile, non-reactive polymeric medium, a high purity, non-volatile carbonaceous material, or other suitable binder or matrix material having high purity and non-volatile, non-reactive character, which is effective to impart structural integrity to the compacted precursor material so that it retains its unitary body form during subsequent handling, packaging, and at least initial use. The binder or matrix material therefore is desirably inert to the solid delivery volatilization and vapor deposition process in which the corresponding precursor material is utilized.

In some instances, the composition of the starting material, with respect to homologous or otherwise closely related compounds in the same starting material, will have an effect on the morphology and physical characteristics of the compacted precursor material unitary body. For example, it has been found that in some instances, mixtures of tungsten pentachloride and tungsten hexachloride having differing minor portions of tungsten hexachloride required different levels of compaction in order to achieve a similar structural integrity and morphological character. It will be appreciated that the specific compaction conditions may be readily empirically determined, to determine the most favorable pressure levels and temperature conditions for specific mixed compositions of related compounds in the precursor starting material. Although mixtures of related materials are contemplated, pure precursor material is preferred for the generation of precursor vapor.

In general, the compaction of the precursor starting material may be carried out at ambient or near-ambient temperature conditions, e.g., at temperature in a range of from 15° C. to 30° C., to effect consolidation of the particulate precursor starting material. In some embodiments, higher temperatures may be employed in the compaction operation, and hotter (elevated temperature) processing in the compaction of the precursor starting material may be desirable in other embodiments to effect consolidation of the particulate precursor starting material.

One embodiment of the Present Application involves forming a compressed precursor composition from solid precursor particulate using at least one of the materials listed above by pressing the material at a temperature between 20-30° C. and a pressure ranging from approximately 4800 psi-48500 psi (approximately 326-3300 atm).

In another embodiment of the Present Application, precursor particulate material of pure compositions of the materials listed above, and combinations formed solely therefrom, are used to form the compressed precursor solid material, where the materials are such that they have a sublimation temperature upon compression of less than 250° C., and can be pressed at a pressure ranging from approximately 4800 psi-48500 psi (approximately 326-3300 atm). Consequently, an advantage of this embodiment is that it minimizes disintegration and cracking of the material when temperatures are less than 250° C., and preferably with a temperature range of 20-30° C., are employed during compression. Furthermore, compressing at a temperature of 20-250° C. will result in a dramatic increase in density of the material, relative to uncompressed forms, such as powdered forms, such that the resulting compressed solid precursor material will achieve at least fifty percent of crystalline density associated with the particulate material from which it is formed.

In another embodiment of the Present Application, substantially pure or completely pure tungsten-pentachloride particulate, in powdered form, is compressed at approximately 4,800 psi (approximately 326 atm) between 20-30° C. In powdered form the density for the tungsten-pentachloride is 0.3-0.5 gm/cm$^3$, whereas upon compression is noted that a density between 3.0-3.2 gm/cm$^3$, where said density was 86 percent of the crystalline density of approximately 3.8 gm/cm$^3$ associated with solid compositions comprising substantially tungsten-pentachloride was found. Furthermore, for this embodiment of the Present Application, a material comprising approximately 85%-95% tungsten-pentachloride and 5%-15% tungsten hexachloride can be used. It should be further noted that an advantage of employing tungsten-hexachloride in conjunction with the tungsten-pentachloride is that the combination increases density and reduces cracking of the resulting compressed solid. Thus, the resulting solid pre-cursor according to this embodiment is approximately 80 percent as dense as a crystalline solid composed of the same material and at least six times as a dense as the powdered form.

In another embodiment of the Present Application, the tungsten-pentachloride-tungsten-hexachloride particulate material, in powdered form, is compressed at a pressure exceeding 35,000 psi at a temperature between 100° C.-175° C., which can result in a compressed solid material with a density exceeding 3.5 gm/cm$^3$.

In another embodiment of the Present Application, precursor material particulate comprising substantially of tungsten-carbonyl, in powdered form, was pressed at approximately 4,800 psi (approximately 326 atm) between 20-30° C. The resulting compressed solid pre-cursor material had a density of approximately of 1.7 gm/cm$^3$, whereas the powdered form of the particulate tungsten carbonyl had a density of 1.0 gm/cm$^3$, and the crystalline density associated with tungsten-carbonyl is approximately 2.6 gm/cm$^3$. Thus, the density of the resulting solid pre-cursor material increased by 70 percent in relation to its particulate form, and had a density of approximately 60% of a pure crystalline solid of tungsten-carbonyl.

Compression of the solid precursor material can be achieved by die pressing, isostatic pressing, by techniques that may be otherwise expressed in this application, or by using other forms of pressing as known in the art. When heating is required, during compression or otherwise, heating can be accomplished by employing electrical resistive heating (heat tape), the desired temperature can be achieved, during compression, by application of a laser source, electrical induction, application of a flame or gas source, through the application of friction, by techniques that may be otherwise expressed in this application, or by using other forms of pressing as known in the art.

It is noted that a benefit of the various embodiments of the Present Application is the ability to increase the density of the compressed pre-cursor material such that more material can be placed inside a carrying vessel, including by not limited to a vaporizer vessel.

Although the compacted unitary body precursor material of the present disclosure may be employed to enable the achievement of higher fluxes of the precursor vapor in relation to the particulate material from which such compacted unitary bodies are formed, the compacted unitary bodies may be utilized under various process conditions in which fluxes equivalent to or even lower than fluxes achievable with the particulate source material of such compacted unitary bodies are generated, but wherein the compacted unitary body form of the precursor material provides other advantages such as ease of handling and resistance to particulate entrainment.

The present disclosure further contemplates a manufacturing facility configured to manufacture a product requiring supply of a vapor from a solid delivery apparatus of the present disclosure, in which the solid delivery apparatus comprises a vaporizer containing a solid delivery precursor of the present disclosure, and in which the manufacturing facility comprises the solid delivery apparatus in a configuration for delivery of vapor from the vaporizer of the solid delivery apparatus to a vapor-utilizing tool in the manufacturing facility.

FIG. 1 is a perspective view of a vaporizer of a type useful in various embodiments of the present disclosure for volatilization of the compacted precursor.

The vaporizer 10 comprises a vessel 12, fabricated of a suitable heat-conducting material, such as for example any of silver, silver alloy, copper, copper alloy, aluminum, aluminum alloy, lead, nickel clad, stainless steel, graphite, silicon carbide-coated graphite, boron nitride, ceramic material, etc., or a combination, mixture or alloy of two or more of such types of material. The vessel may also comprise protective coatings on surface(s) thereof.

The vessel comprises a floor 14 and circumscribing sidewall 16 that together form an interior volume of the vessel. The vessel can have any suitable shape that facilitates an even flow of carrier gas through the interior volume thereof. In the illustrative embodiment shown in FIG. 1, the vessel has a cylindrical shape. The vessel includes a lid 18 on which is mounted a carrier gas inlet valve 20 arranged to selectively introduce carrier gas into the interior volume of the vessel, when the valve is open.

Positioned in the internal volume of the vessel is a plurality of vertically stacked trays 22. The stacked trays are separable from each other and removable from the vessel for easy cleaning and refilling. Positioned within the vessel is an internal carrier gas downtube 23 that is connected, e.g., by welding, brazing, or the like, to a gas inlet in the lid associated with inlet valve 20 and conveys the carrier gas to the bottom of the internal volume below the lowest tray in the array of vertically stacked trays. In the embodiment shown, the downtube 23 passes through a cylindrical collar of each tray that extends through the floor of the tray. To assist in ensuring a leak-proof seal at the juncture of the downtube with the floor of the tray, a sealing O-ring 38 may be positioned between successive trays. An additional outer O-ring can also be employed to seal between trays on the top surface of each tray sidewall.

As illustrated, each of the individual trays 22 has a floor and sidewall to form a tray cavity for placement and support of the unitary bodies of compacted precursor. The trays are preferably fabricated of a non-reactive heat-conducting material, such as for example silver, silver alloy, copper, copper alloy, aluminum, aluminum alloy, lead, nickel clad, stainless steel, graphite, silicon carbide-coated graphite, boron nitride, ceramic material, or a combination, mixture or composite of two or more of the foregoing. The trays may be in vertically spaced-apart relationship to one another in the interior volume of the vaporizer vessel, as a stack of successive trays. In such stack of trays, the spacing between adjacent trays may be constant throughout the stack, or alternatively, the trays may be spaced apart by different spacing distances, to provide for optimum consumption of the precursor material in the operation of the vaporizer, so that the precursor vapor generation flux in the interior volume of the vaporizer vessel is maintained at a suitably high level throughout such interior volume.

When the vaporizer vessel interior volume contains an array of precursor material-supporting trays, the trays may be the same as one another, or alternatively, the array of trays may comprise trays of different types. For example, in various embodiments, the trays may be of different heights, surrounded by circumscribing side walls, so that the volume of compacted unitary bodies of the precursor material held by different trays in the array may be varied. Thus, a tray with a higher side wall may be employed to hold a greater volume of the compacted unitary bodies of the precursor material than is held by a tray having a shorter side wall.

Each of the individual trays in the illustrated embodiment of FIG. 1 comprises a plurality of through-tubes 30 wherein each through-tube includes a passageway for movement of a carrier gas through the through-tube. The through-tubes can have any shape or configuration that provides for flow of gas therethrough. Preferably, the through-tubes are cylindrical or conical in shape. The through-tubes in various embodiments extend upwardly from the floor of the tray and define a central passageway communicating with a corresponding opening in the tray floor. In other embodiments, the through-tubes extend upwardly from the floor the tray in the same manner, but also extend downwardly below the tray, so that the central passageway is enclosed by the through-tube, e.g., as a central bore thereof, both above and below the floor of the tray.

The through-tubes can be secured to the floor of the tray in any suitable matter, e.g., by welding, brazing, mechanical fastener attachment, press-fit, swaging, etc. In the alternative, the through-tubes can be integrally formed as part of the tray floor. In a specific embodiment, the height of each of the through-tubes is approximately the same height as that of the tray sidewall, although other embodiments are contemplated, in which the height of each of the through-tubes is greater or less than such sidewall.

The side walls of the respective trays may be of sufficient height, so that the trays are stackable to form a vertically extending stacked array in the interior volume of the vessel of the vaporizer.

In further embodiments, the trays may be fabricated without sidewalls, and may be mounted in the interior volume with the aid of supports on the interior wall surface of the vessel, with circumferential sealing gaskets, or other mounting structure or elements. Additional embodiments are contemplated, in which the trays are mounted in vertically spaced-apart relationship to one another, as an assembly. For example, the trays can be mounted on a frame or other positioning structure, as a unitary array that is inserted into and withdrawn from the interior volume of the vessel, as desired, during the assembly and disassembly of the vaporizer.

In one specific embodiment, each of the trays has a circumscribing sidewall, and the height of each through-tube is less than the height of the tray sidewall, thereby providing a head space above the end of the through-tube for gas dispersion and circulation within the respective tray.

Alternatively, or additionally, the trays can be fabricated with porous openings therein, with the compacted unitary bodies of the precursor supported on the top surface of the tray, with the carrier gas being flowed through the through-tubes and/or porous openings, to take up precursor vapor volatilized from the compacted solid bodies of precursor during the operation of the vaporizer. It will be understood that the dimensions of the through-tubes and/or porous openings that are present in the tray structures will be such as to retain the compacted solid bodies of precursor supported on the tray. In various other embodiments, each of the trays, or alternatively one or more thereof, may be formed of a porous frit material, such as a sintered metal matrix, or a sintered ceramic matrix material, providing permeation passages through which gas may flow in the vapor generation operation, and on which the compacted precursor material is supported.

Porous frits may also be employed at the precursor vapor outlet of the vaporizer apparatus, to filter the precursor vapor being discharged so that it is free of particulates to a desired extent. Porous frits may also be employed at a carrier gas inlet of the vaporizer apparatus, to correspondingly filter the carrier gas being introduced to the vaporizer apparatus for contact with the compacted unitary bodies of precursor material.

In various embodiments, each through-tube extends vertically upwardly from the bottom of the tray to a height that can for example be in a range of from about 0.5 mm to about 5 mm, and more preferably in a range of from about 1.5 mm to about 3.0 mm.

As shown in FIG. 1, the positioning of the through-tubes in each tray may be slightly offset from the positions of the through-tubes in an adjacent tray, thereby forcing the carrier gas to circulate within the tray for contact of the carrier gas with the compacted solid bodies of precursor before the resulting gas mixture of carrier gas and precursor vapor is transported through the through-tubes into the next-adjacent tray region. By such arrangement, the multiple levels of contacting of the carrier gas with the compacted solid bodies of precursor permits the carrier gas to become saturated in a highly efficient manner.

The size of the vaporizer 10 can be widely varied depending on the amount of the vapor to be supplied to the downstream fluid-utilizing installation, such as a chemical vapor deposition (CVD) apparatus, a pulsed CVD apparatus, an atomic layer deposition (ALD) apparatus, an ion implantation system, a sputtering apparatus, or a vapor phase epitaxy apparatus. In various embodiments, the vaporizer has a cylindrical conformation with an inner diameter that may be in a range of from about 3 to 6 inches. The number of trays in the interior volume of the vaporizer vessel will be determined by the size of the vaporizer. In various embodiments, from three to five trays are enclosed in the vaporizer vessel.

The vaporizer containing a multiplicity of trays can be heated and kept at a desired temperature appropriate to the compacted solid bodies of precursor to be vaporized, the desired concentration of the precursor vapor in the carrier gas mixture that is delivered from the vaporizer to the downstream precursor vapor-utilizing facility, and the specific set of operating conditions that is employed in the vaporization operation.

Heating of the vaporizer vessel can be conducted in any suitable manner. In one embodiment, a ribbon heater is wound around the vaporizer. In another embodiment, a block heater having a shape covering at least a major portion of the external surface of the vaporizer is employed to heat the vaporizer vessel. In still another embodiment, a heat transfer fluid at elevated temperature may be contacted with the exterior surface of the vaporizer vessel, to effect heating thereof. A further embodiment involves heating by infrared or other radiant energy being impinged on the vaporizer vessel. The flow circuitry associated with the vaporizer vessel, or selected components or parts thereof, may also be heated, as necessary or desirable in specific implementations of the solid delivery process.

The invention in a further embodiment contemplates heating of the source reagent by circulation of a hot gas in the vessel, to effect convective heating of the compacted solid bodies of precursor in the vaporizer.

The method of heating of the vaporizer vessel is not particularly limited as long as the vaporizer is brought thereby to a desired temperature level for volatilization of the compacted solid bodies of precursor and maintained at such temperature level in an accurate and reliable manner.

It is desirable to heat the vaporizer vessel in a thermally homogeneous fashion, so that temperature deviations in the interior volume of the vessel are minimized. In specific embodiments, in which the trays are in direct thermal contact with the wall, heating of such trays via thermal conduction from the wall affords a convenient and effective way to vaporize the compacted solid bodies of precursor on the trays.

It may be desirable in some applications to utilize added surface area structures in the interior volume of the vaporizer vessel, to enhance the extent and rate of heating of the compacted solid bodies of precursor for volatilization thereof.

As another expedient for achieving high efficiency vaporization of the compacted solid bodies of precursor, the carrier gas may be heated prior to its introduction to the interior volume of the vaporizer vessel, to assist the heating of the compacted solid bodies of precursor and volatilization thereof. For example, the flow line supplying the carrier gas to the inlet valve 20 may be heat-traced, or otherwise subjected to heating, to effect delivery of the carrier gas to the vaporizer vessel at a desired temperature level.

In some applications, it may be desirable for the vaporizer vessel to have a large thermal mass, in order to maintain a more consistent temperature during processing. The specific temperature of the vaporizer that is employed in a given application will depend on the operating conditions of the downstream precursor vapor-utilizing apparatus, e.g., CVD apparatus, ALD apparatus, or ion implantation system, and the specific type, vapor pressure, and the amount of the compacted solid bodies of precursor that is provided. In various embodiments, vaporizer temperatures may be employed in suitable ranges or at suitable values, e.g., in a range of from about 40° C. to about 300° C., in a range of from 200° C. to 300° C., or in other specific temperature ranges.

The vaporizer delivery system utilizing compacted solid bodies of precursor can in specific embodiments variously further comprise: lines for supplying a carrier gas to the vaporizer vessel; lines for discharging source reagent vapor from the vaporizer vessel; flow circuitry components such as flow control valves, mass flow controllers, regulators, restricted flow orifice elements, thermocouples, pressure transducers, monitoring and control devices, heaters for input of thermal energy to the vaporizer vessel, heaters for maintaining temperature in the carrier gas supply lines and source reagent vapor discharge lines, etc.

In some embodiments, heating of precursor vapor discharge lines is conducted to maintain temperature higher than the vaporization temperature in order to prevent condensation in such discharge lines. The extent of heating of the discharge lines may be of any suitable level that provides the requisite safety margin for avoidance of condensation. For example, in specific applications, the lines may be heated to temperature of 5-10° C. above the vaporization temperature of the precursor material. In other embodiments, it may be desirable to heat the precursor vapor discharge lines to high temperatures approaching, but less than, the decomposition temperature of the precursor vapor.

It will be appreciated that the vaporizer apparatus utilized for volatilization of the compacted solid bodies of precursor in accordance with the present disclosure may be of widely varying types, and may be similar to, or alternatively markedly different from, the specific vaporizer illustratively described in connection with FIG. 1. For example, the vaporizer may utilize other support structures for the compacted solid bodies of precursor, or alternatively may comprise a vaporizer vessel that is fully packed with a bed of the compacted solid bodies of precursor without specific ancillary support structures or surface in the interior volume of the vessel.

The features and advantages of the compacted precursor of the present disclosure are more fully shown with reference to the following non-limiting example, as illustrating a specific embodiment of the disclosure.

Example 1

Compacted pellets of tungsten pentachloride were prepared from a starting material of powder form of such precursor, having a particle size of 40-90 μm and a powder density of 0.3-0.5 g/mL before pelletizing. The pressure applied to the starting powder material was 4800 psi. The resulting pellets were disc-shaped, with a cylindrical form, having a diameter of 13.8 mm and a thickness of 2.0-2.7 mm. The density of the pellets ranged from 3 to 3.2 g/mL. One kilogram (1 kg) of the pellets were loaded in a Mega-Vap™ vaporizer (Entegris, Inc., Billerica, Mass., USA) and heated to generate corresponding precursor vapor. The results were compared to a corresponding prior test ("Prior Baseline"), in which one kilogram (1 kg) of the powder form starting material was introduced to a same vaporizer under the same heating conditions to generate precursor vapor.

Successive runs were conducted at two different sets of process conditions. The first set of process conditions (Run 1) included operation of the vaporizer for generating precursor vapor for a period of 4 hours, at a vaporizer temperature of 165° C., a carrier gas flow of argon at volumetric flow rate of 500 standard cubic centimeters per minute (sccm) through the vaporizer, a vaporizer pressure of 60 torr, with carrier gas preheating (+5° C.), vaporizer valve heating (+10° C.), and discharge gas line heating (+20° C.). The second set of process conditions (Run 2) included operation of the vaporizer for generating precursor vapor for a period of 4 hours, at a vaporizer temperature of 160° C., a carrier gas flow of argon at volumetric flow rate of 200 standard cubic centimeters per minute (sccm) through the vaporizer, a vaporizer pressure of 15 torr, with carrier gas preheating (+5° C.), vaporizer valve heating (+10° C.), and discharge gas line heating (+20° C.).

Figure 2:
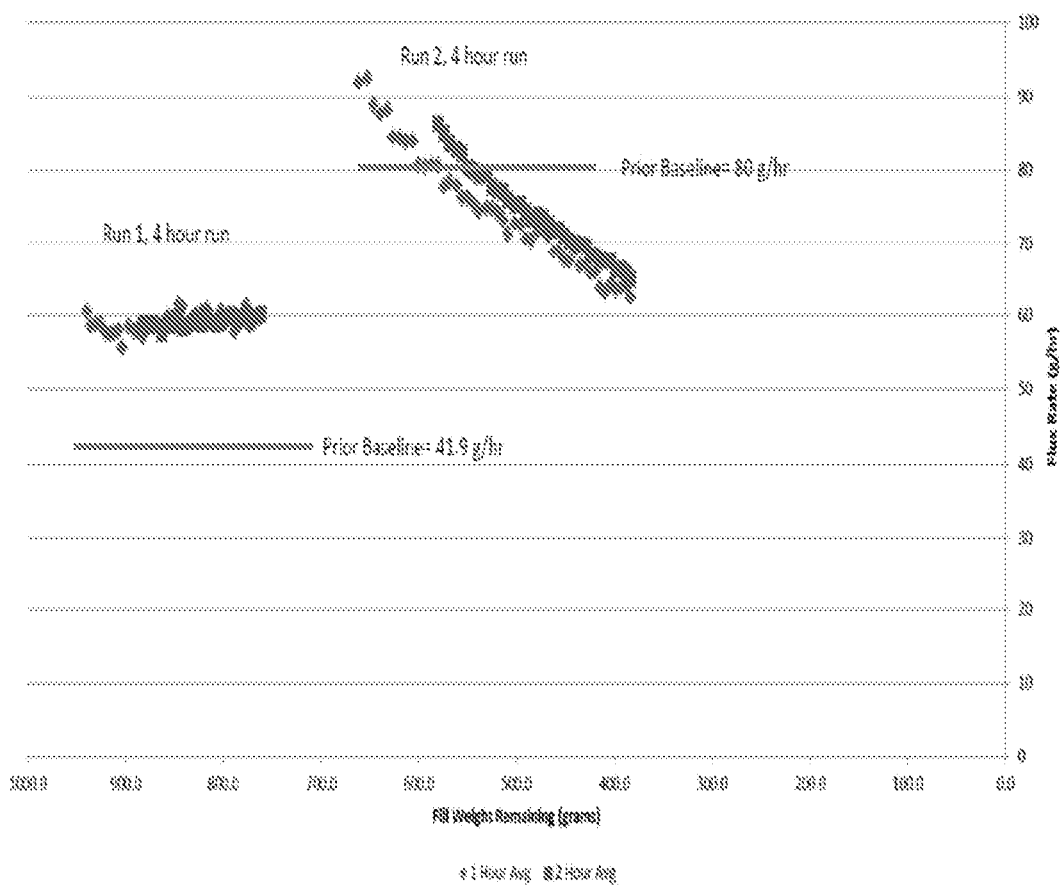
FIG. 2 is a graph of flux rate of precursor vapor, in grams per hour (g/hr), as a function of fill weight of precursor remaining in a vaporizer, in grams, for each of Runs 1 and 2, against a respective Prior Baseline, plotted as one hour average data (♦) and as two hour average data (■) in the respective Runs 1 and 2 for the precursor vapor fluxes measured for compacted precursor pellets, against precursor vapor flux measured for corresponding lower density powder precursor material under corresponding vaporization conditions in the Prior Baseline test.

Results of the successive tests are shown in FIG. 2, in which flux rate of the precursor vapor, in grams per hour (g/hr), is plotted as a function of fill weight of precursor remaining in the vaporizer, in grams, for each of Runs 1 and 2, against the respective Prior Baseline. The data in FIG. 2 are plotted as one hour average data (♦) and as two hour average data (■) in the respective Runs 1 and 2 for the precursor vapor fluxes measured for the compacted precursor pellets, against the precursor vapor flux measured for the corresponding powder precursor material under corresponding vaporization conditions.

For the 4 hour period of operation of the vaporizer in Run 1, the precursor vapor flux from the vaporizer vessel containing the pelletized precursor was consistently in a range of from 56 to 62 g/hr of precursor vapor, versus the Prior Baseline precursor vapor flux of 41.9 g/hr, representing an increase in precursor vapor flux of 34-48% increase, with an average increase of over 40%.

For the 4 hour period of operation of the vaporizer in Run 2, the precursor vapor flux from the vaporizer vessel at the inception of vaporizer operation was substantially above the Prior Baseline precursor vapor flux value of 80 g/hr, with the initial one hour average value for vapor generation using the pelletized precursor being 15% higher than the Prior Baseline value, and with the initial 2 hour average value for vapor generation using the pelletized precursor being on the order of 10% higher than the Prior Baseline value.

The respective flux levels for the pelletized precursor in Run 2 exhibited a continuous decline to levels below the Prior Baseline value, but such inconsistency with the Run 1 data was attributed to the vaporizer being at an early point of depletion of solid in the operation of the vaporizer, since the vaporizer in Run 1 was fully loaded with the pelletized precursor, whereas the vaporizer in Run 2 contained less than 70% of the amount of the pelletized precursor and was more rapidly depleted at a substantially higher flux level than was carried out in Run 1. Nonetheless, the data show that by appropriate selection of process conditions, it is possible to achieve markedly higher levels of precursor vapor flux from the vaporizer vessel using the compacted precursor of the present disclosure, as compared to the flux levels achievable using powdered precursor.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A solid delivery precursor volatilized to generate precursor vapor for a vapor deposition process, wherein said solid delivery precursor is a compacted solid body of particulate precursor selected from the group consisting of hafnium chloride, zirconium chloride, pentakisdimethylamino tantalum (PDMAT), trimethylindium, bis-cyclopentadiene magnesium, tetramethyl zinc, tetraethyl zinc, tungsten hexacarbonyl, tungsten pentachloride, tungsten hexachloride, metal amidinates, metal formamidinates, and metal carboxylates, and wherein the solid delivery precursor comprises the particulate precursor compacted at a temperature of from 15° C. to 30° C. and has a bulk density that is at least 15% higher than a bulk density of the particulate precursor or is at least 80% of an absolute density of the particulate precursor.

2. The solid delivery precursor of claim 1, wherein said compacted solid body of particulate precursor is in a form of pellets, platelets, tablets, beads, discs, or monoliths.

3. The solid delivery precursor of claim 1, wherein the compacted solid body of particulate precursor exhibits a precursor vapor flux when heated in a volatilization operation that is substantially higher than precursor vapor flux exhibited by the particulate precursor under corresponding volatilization operation conditions.

4. The solid delivery precursor of claim 3, wherein the precursor vapor flux exhibited by the compacted solid body of particulate precursor is at least 15% higher than the precursor vapor flux exhibited by the particulate precursor under corresponding volatilization operation conditions.

5. The solid delivery precursor of claim 1, wherein the compacted solid body of particulate precursor comprises at least one precursor selected from the group consisting of tungsten hexacarbonyl, tungsten pentachloride, and tungsten hexachloride.

6. The solid delivery precursor of claim 1, wherein the compacted solid body of particulate precursor comprises a binder or matrix material.

7. The solid delivery precursor of claim 6, wherein the binder or matrix material comprises a non-volatile, non-reactive polymeric material.

8. The solid delivery precursor of claim 6, wherein the binder or matrix material comprises a high purity, non-volatile carbonaceous material.

9. The solid delivery precursor of claim 1, wherein the compacted solid body of particulate precursor comprises homologous compounds.

10. The solid delivery precursor of claim 1, wherein the compacted solid body of particulate precursor comprises tungsten pentachloride and tungsten hexachloride.

* * * * *